Oct. 12, 1965

F. W. KRUSE, JR 3,212,015

BROADBAND CRYSTAL DIODE DETECTOR

Filed May 14, 1962

INVENTOR.
FREDERICK W. KRUSE, Jr.
BY Harvey J. Lawhurst
ATTORNEY

United States Patent Office 3,212,015
Patented Oct. 12, 1965

3,212,015
BROADBAND CRYSTAL DIODE DETECTOR
Frederick W. Kruse, Jr., Palo Alto, Calif., assignor to Alfred Electronics, Palo Alto, Calif., a corporation of California
Filed May 14, 1962, Ser. No. 194,568
12 Claims. (Cl. 329—162)

This invention relates to crystal diode detectors and more particularly to a crystal diode detector having an exceptionally flat frequency response over a wide portion of the RF (radio frequency) signal band. The term detector as used herein refers to the combination of a crystal diode and a complete mounting assembly, including the terminal connectors.

The use of the crystal diodes in RF signal detectors is well known because of their small size, high efficiency, and negligible transit time. The most desirable characteristics of detectors include a flat, constant response over a large frequency range to provide frequency independence, a high sensitivity to make possible the detection of low amplitude signals, and a small VSWR (voltage standing wave ratio) to keep the disturbance caused by the introduction of the detector into a system at a minimum.

It is therefore a primary object of this invention to provide a crystal diode detector having an exceptionally flat response over a large frequency range which extends through the UHF, VHF and microwave frequency ranges, a high sensitivity and a low VSWR.

It is a further object of this invention to provide an improved crystal diode detector which can easily be assembled and disassembled, which is rugged in design, and which has electrical characteristics not realizable heretofore.

It is another object of this invention to provide a crystal diode detector whose input section includes means for selecting proper impedance values for good mid-frequency control and good high frequency control of the RF signal to the crystal diode.

It is still a further object of this invention to provide a crystal diode detector utilizing a crystal diode which is encased in a non-metallic envelope for minimum shunt capacitance so that an input impedance may be selected to optimize the mid-frequency and the high-frequency response.

It is still another object of this invention to provide a crystal diode detector which includes an output section having the circuit function of a low-pass filter for good recovery of the intelligence modulated upon the RF signal.

Generally speaking, the crystal diode detector of this invention includes a coaxial input section having a selected series and shunt impedance carried by a low loss dielectric body, a coaxial output section having the characteristic of a multi-section low-pass filter, and a crystal diode within a non-metallic envelope connecting the center conductor of the input and output sections. The crystal diode is resiliently urged, by a spring forming a portion of the center conductor of the output section, against the center conductor of the input section.

Other objects and a better understanding of the invention may be had by reference to the following description, taken in conjunction with the accompanying drawings, in which.

Figures 1, 2, 3:
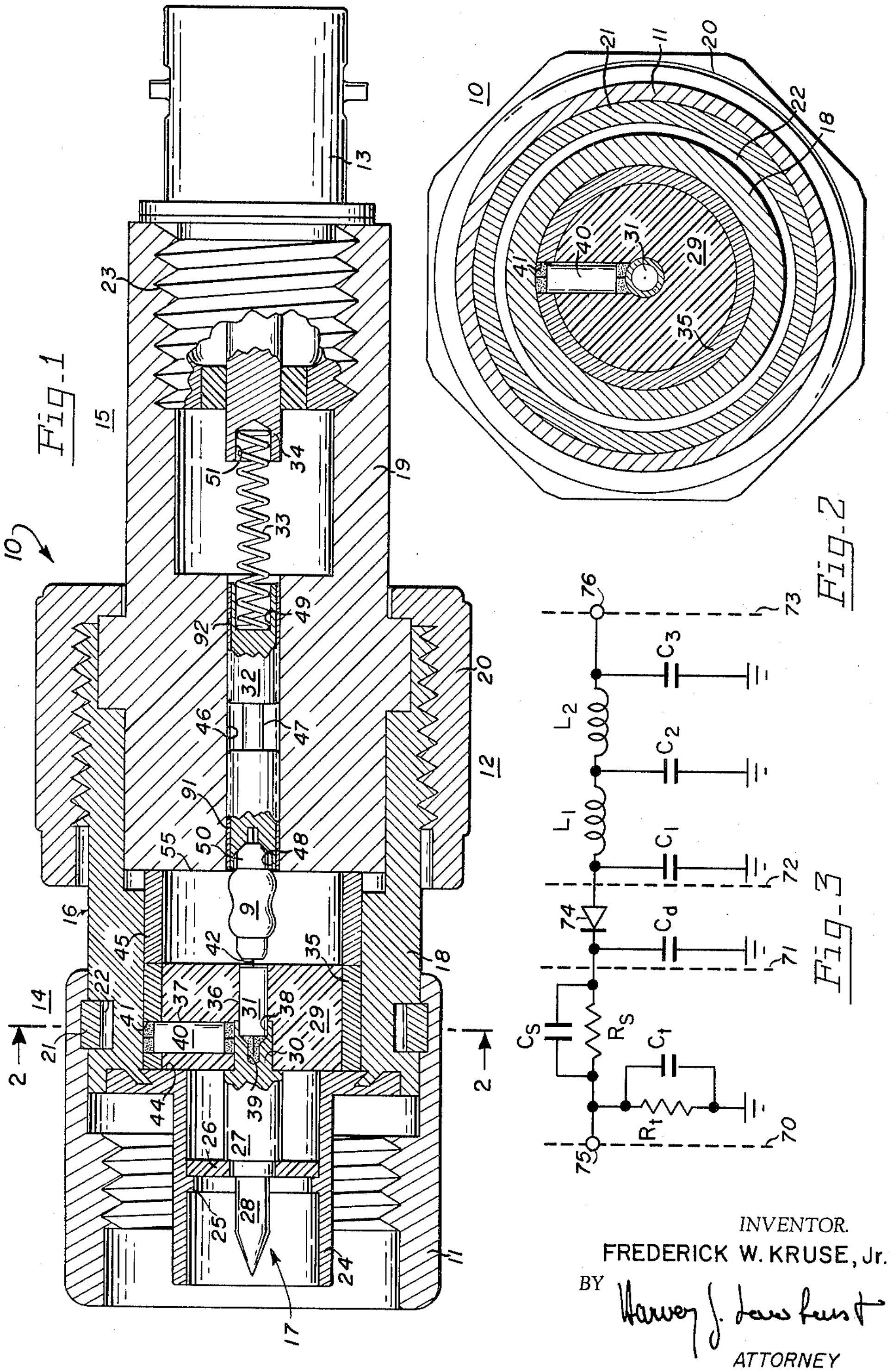
FIG. 1 is a cross sectional view of the crystal detector of this invention, enlarged several times beyond life size.
FIG. 2 is a section taken along line 2—2 of FIG. 1.
FIG. 3 is a schematic equivalent circuit diagram useful in explaining the operation of this invention.

Referring now to the drawings, in which like reference characters indicate like parts, the crystal diode detector 10 there shown may be regarded as a coaxial transmission structure having an input connector 11, a body 12, and an output connector 13. Body 12 includes an input portion 14, an output portion 15 and a crystal diode 9 conductively connecting the center conductor of the input and output portions 14 and 15.

Input connector 11 and output connector 12 may be selected to suit such, as for example, the type N (male) and type BNC (female) connectors shown and do not form a part of this invention.

Body 12 comprises essentially a coaxial transmission structure having an outer conductor 16 surrounding an inner conductor 17. Outer conductor 16 includes a metallic input and output member 18 and 19 clamped axially to one another by a metallic clamping nut 20. Input connector 11 may be mounted directly to input member 18 by means of a locking spring 21 accommodated in a suitable locking spring groove 22. Similarly, output connector 13 may be mounted directly to output member 19 by means of a suitable threaded portion 23.

Input member 18 has rigidly mounted thereto a contact finger member 24 which may be of standard configuration, and which is provided with an inner shoulder 25 for impedance correction at the shoulder of center pin 27 and for engaging a disk-like pin support 26 made of a low-loss dielectric. Pin support 26 may be made of Teflon having an inner bore into which a pin 27 may be press-fitted.

Pin 27 has the standard pointed end portion 28 and forms a section of inner conductor 17 coaxially supported within outer conductor 16 by support member 26 and a low-loss dielectric member such as a Teflon cylinder 29. Pin 27 is provided with a reduced diameter end portion 30 which is press-fitted in cylinder 29. The remaining sections of center conductor 17 are formed of a resistor 31, crystal diode 9, a plunger 32, a spring 33 and the center conductor 34 of connector 13.

Cylinder 29, which is press-fitted into a conductive sleeve 35, such as brass or any other material capable of being soldered, includes an axial bore 36 and a radial bore 37. Axial bore 36 is stepped, one portion being dimensioned to permit the shank portion 30 of pin 27 to be press-fitted therein, and the other portion being dimensioned to permit axial resistor 31 to be press-fitted therein. End portion 30 of pin 27 is provided with a dead-ended bore which includes a cylindrical portion 38 of a diameter to permit accommodation of resistor 31 and of a selected depth as will be described hereinafter in more detail. Cylindrical bore portion 38 is terminated in a small diameter bore 39 into which one lead of resistor 31 is securely soldered to provide good electrical contact between pin 27 and resistor 31. The outer diameter of conductive sleeve 35 is dimensioned to slidingly fit into input member 18.

Radial bore 37 of cylinder 29 holds an axial resistor 40 which is press-fitted therein. Resistor 40 has its respective leads soldered to the outer surface of pin 27 and to sleeve 35 so that a good electrical contact is provided therebetween. To insert resistor 40 into cylinder 29, an opening 41 is provided in sleeve 35 through which resistor 40 may be inserted. After insertion of resistor 40, opening 41 may be filled with solder to make a good electrical connection between resistor 40 and sleeve 35. The term "axial" resistor as used herein refers to a fixed resistor of rod-like configuration having axial leads. The axial resistor may be either of the film, composition, or wire wound type.

The lead 42 of resistor 31 is cut very short to keep its length an absolute minimum and to thereby reduce its inductive impedance. Lead 42 contacts crystal diode 9 which is urged against resistor 31 by spring 33. Sleeve encased cylinder 29 is securely held in place against an inner shoulder 44 of member 24 by a metallic spacer 45 interposed between the end face of output member 19 and sleeve 35. The material of which spacer 45 is made is carefully selected to be non-electrolytic with respect to its adjacent metallic parts, particularly sleeve 35. For example, if sleeve 35 is made of brass, spacer 45 may be made of stainless steel.

Plunger 32 is made preferably of aluminum and is dimensioned for sliding accommodation into a bore 46 of output member 19 whose diameter is selected slightly larger than the outside diameter of crystal diode 9. To provide electrical insulation between plunger 32 and output member 19, the outer peripheral surface of plunger 32 is anodized, as shown at 91 and 92, to a depth of, say, one or two ten-thousandths of an inch. Plunger 32 includes a recessed portion 47 of selected length, diameter and axial position whose purpose will be explained presently. Plunger 32 is also provided with dead-ended axial bores 48 and 49, one at each end. Bore 48 includes a cylindrical portion of a diameter sufficiently large to permit the metallic end portion 50 of crystal diode 9 to be inserted therein, a tapered portion forming a conical surface parallel to the conical end portion of crystal diode 9, and a small diameter bore into which the pigtail of diode 9 may be recessed. The pigtail in the holes extends the crystal diode in essentially axial alignment during insertion of body 19 into section 18.

Detector 10 is easily disassembled for servicing such, as for example, the replacement of diode 9. To disassemble detector 9, clamping nut 20 is loosened and may be entirely withdrawn by moving the nut to the right as seen in FIG. 1. Thereafter, output member 19 is withdrawn from output member 18 leaving cylinder 29 and spacer 45 within member 18. Diode 9 is then merely lifted out of seat 48 and replaced.

Bore 49 of plunger 37 may be of cylindrical shape and is dimensioned to accommodate the end of extension spring 33. The other end of extension spring 33 is fitted into a suitable bore 51 provided in inner conductor 34 of output connector 13.

The operation of the crystal diode detector of this invention will now be explained. As is well known to those skilled in the art, the RF frequency range over which a flat response is obtained with a crystal diode detector depends primarily on the RF impedance of the combination of the crystal diode and the coaxial transmission structure on the input side of the crystal diode.

FIG. 3 shows an equivalent circuit in which the portion between dotted lines 70, 71 depicts the impedance of the coaxial transmission structure forming the input portion of detector 10, the portion between dotted lines 71, 72 depicts the impedance of the coaxial transmission structure coextensive with crystal diode 74 (as far as pertinent to the ensuing description) and the portion between dotted lines 72, 73 depicts the impedance of the coaxial transmission structure forming the output portion of detector 10. Input and output terminals are respectively designated by reference characters 75 and 76.

For a flat response over an extended frequency range it is essential that the impedance of the crystal diode portion, and particularly the Q of the combination of the crystal diode and the surrounding structure, be adjustable with the impedance of series resistor $R_s$. This has been found possible only if $C_d$, the shunt capacitance to crystal diode 74, is kept at an absolute minimum. The shunt capacitance $C_d$ is primarily the capacitance between the whisker and the outer conductor of the coaxial transmission structure, and, in connection with the internal diode shunt capacitance, determines the resonant frequency of the crystal diode portion.

To keep $C_d$ at a minimum, crystal diode 9 is selected to have a non-metallic envelope such as, for example, a glass envelope. Selection of a glass encased point contact crystal diode such as Sylvania diode No. IN833 has been found eminently satisfactory because of its small capacitance $C_d$ when inserted into detector 10.

Of course, capacitance $C_d$ is influenced by the proximity or inner diameter of the outer conductor surrounding diode 9. For this reason the inner diameter of spacer ring 45 is made sufficiently large to keep $C_d$ at a minimum. In practice, it has been found that the inner diameter of spacer ring 45 need not exceed one-half of the minimum wavelength of interest. Further, the axial length of spacer ring 45 is selected such that when detector 10 is properly assembled, the planar end face 55 of member 19 remains on the side of the crystal pellet opposite the side occupied by the crystal whisker.

In other words, the axial portion occupied by the crystal whisker is kept out of bore 46. If the whisker portion of crystal diode 9 were allowed to become coextensive with bore 46, the effect would be similar to enclosing crystal diode 9 in a metallic envelope and would result in too much capacitance. Because of the small shunt capacitance $C_d$, resulting from the above described arrangement, the resonance frequency of the crystal diode section becomes very high and the Q becomes controllable through resistor $R_s$ in the input section.

A series resistor 31, FIG. 1, having a resistive impedance $R_s$ is selected to optimize the Q of the crystal diode section for proper control of response over the high frequency portion of the RF frequency range. In crystal diode detectors of the prior art, the resonance frequency of the crystal diode section was usually not sufficiently high to afford an opportunity of utilizing a resistor $R_s$ as a parameter for optimizing the high frequency response of such prior art detectors.

The series capacitance $C_s$ is then carefully selected or tuned to provide proper mid-frequency control. Again, unless $C_d$ is reduced to an absolute minimum so that the resonance frequency of the crystal diode section is at a realizable maximum, this inherent series capacitance $C_s$ is usually too high to utilize $R_s$ as a controlling parameter. In the instant invention, $C_s$ is made of two contributors, one being the series capacitance across resistor 31 itself and the other being the capacitance between resistor 31 and pin section 30. This last mentioned capacitance provides an adjustable or controllable parameter since the magnitude of the capacitive impedance depends on the depth of bore 38 or penetration of resistor 31 into bore 38.

To provide a small VSWR (voltage standing wave ratio), resistance 40, FIG. 1, is selected to have a resistive impedance $R_t$ which is parallel with the combination of all other impedances shown, and is essentially equal to the terminating impedance looking back into the terminal to which detector 10 is connected. The difficulty usually encountered in providing the proper terminating impedance is that resistor 40 has capacitance, indicated as capacitive impedance $C_t$. Unless $C_t$ is kept as small as possible, the VSWR at high frequencies cannot be minimized.

It is for this reason that only a very small single axial resistor 40 is utilized between pin 27 and input body member 18. Further, the series inductance of resistor 40 is also desired as small as possible. For this reason the space around the lead of resistor 40 within opening 41 of sleeve 35 may be filled with solder to provide as broad a conductive path as possible.

The low-pass filter formed by the coaxial transmission structure forming the output portion of detector 10 is also shown by the equivalent circuit of FIG. 3. The first cylindrical portion of plunger 32 on the left side (as seen in FIG. 1) of reduced section 47 functions as a capacitor having a capacitive impedance indicated by $C_1$, the reduced section 47 functions as an inductance indicated by inductive impedance $L_1$ and the second cylindrical portion of plunger 32 on the right side of section 47 functions as a capacitor having a capacitive impedance $C_2$.

Spring 33 operates as an inductance having an inductive impedance $L_2$ and connector 13 operates as a capacitor with a capactive impedance $C_3$. It is therefore seen that the low-pass filter, as far as the equivalent circuit is concerned, is a series-inductance, shunt-capacitance filter. The filter parameters are selected to provide an output signal at terminal 76 which is essentially free of the carrier or RF frequency.

To obtain a capacitive impedance $C_1$ and $C_2$ as high as possible per unit length of plunger 32, the gap between plunger 32 and bore 46 should be a minimum. The capacitance per unit length is proportional to the ratio of $1/\log D/d$ where D is the inner diameter of bore 46 of body member 19 and *d* is the outer diameter of plunger 32. For a gap having a constant width this ratio will tend to infinity as D tends to infinity. However, the larger diameter *d*, or the D, the larger becomes its inductive impedance. Since this impedance should be kept at a minimum it has been found that as long as *d* is selected to be approximately of the same order of magnitude and somewhat larger than the diameter of crystal diode 9, a good compromise is provided.

To provide maximum capacitance per unit length therefore, the gap width must be reduced to a minimum. It has been found that anodizing the surface of plunger 32, as shown at 91 and 92, provides a good electrical insulating surface and a durable sliding surface. Depth of anodization of 1 to 2 ten thousandths of an inch has produced excellent results. Total gap width, of 3 or 4 ten thousandths, including the anodizing film, is thereby possible.

There has been described a crystal diode detector which provides a flat constant response over a large frequency band. In fact, a detector constructed in accordance with the teachings herein provided a sensitivity variation of ±1 db over a frequency range extending from below 10 megacycles per second to above 12.5 kilomegacycles per second. Furthermore, a sensitivity of 0.2 volt per milliwatt and a VSWR smaller than 2.0:1 has been realized for a standard RF input impedance of 50 ohms.

One of the reasons for this exceptionally flat frequency response is the utilization of a structure in which the resonant frequency of the crystal diode and coaxial structure combination may be maximized allowing the optimization of the Q of the cyrstal diode and structure combination for high frequency response and mid-frequency response. Further, a very low VSWR is provided by selecting a terminating resistance having a minimum shunt capacitance.

Also, a new and novel means has been described for supporting the crystal diode within the detector for minimizing the gap in the low-pass output filter for obtaining maximum capacitive impedance per unit length of the plunger by use of an anodized surface between the plunger and the outer conductor.

What is claimed is:

1. A crystal diode detector comprising: a tubular conductor; a crystal diode axially disposed within said tubular conductor and having an envelope of dielectric material extending along a substantial portion of its axial length; a first center conductor portion axially supported within and by said tubular conductor on one side of said crystal diode; an axially disposed resistor, having a selected resistive impedance, conductively coupled between said first center conductor portion and said crystal diode; a radially disposed axial resistor, having a selected resistive impedance, conductively coupled between said first center conductor portion and said tubular conductor; and a second center conductor portion on the other side of said crystal diode axially supported by and within said tubular conductor and conductively coupled to said crystal diode.

2. A crystal diode detector comprising: a tubular conductor; a crystal diode axially held within said tubular conductor and including a non-metallic envelope extending along a substantial portion of its axial length; a first center conductor portion axially supported within and by said tubular conductor on one side of said crystal diode; an axially disposed resistor, having a selected resistive impedance, conductively coupled to said first center conductor portion; a radially disposed resistor, having a selected resistive impedance, conductively coupling said first center conductor portion to said outer conductor; a second center conductor portion on the other side of said crystal diode and conductively seating said crystal diode, said second center conductor portion having an anodized peripheral surface dimensioned for sliding reception by said tubular conductor; a third center conductor portion axially supported within and by said tubular conductor; and compressible conductive spring means mounted between and in conductive contact with said second and said third center conductor portions for urging said second center conductor portion and thereby said crystal diode into electrical contact with said axially disposed resistor.

3. A crystal diode detector comprising: a tubular conductor; a crystal diode axially disposed within said tubular conductor and having a non-conductive envelope extending at least along a substantial portion of its axial length; a spacer body slidingly received by said tubular conductor on one side of said crystal diode, said spacer body comprising an outer metallic sleeve mounted about a non-conductive body portion and slidingly received by said tubular conductor; a first center conductor portion axially supported by said spacer body on one side of said crystal diode, said first center conductor portion including a closed bore of selected depth; an axial resistor, having a selected resistive impedance, partially accommodated in said bore and partially supported by said spacer body along the axis of said tubular conductor, said axially disposed resistor having one of its terminal leads connected to the end of said bore; a further resistor, having a selected resistive impedance, supported by said spacer body along a radius of said tubular conductor and conductively coupling said first center conductor portion to said outer metallic sleeve; a second center conductor portion on the other side of said crystal diode and dimensioned for sliding axial reception by said tubular conductor, said second center conductor portion including seating means for conductively seating said crystal diode; and a third center conductor portion axially supported within and by said tubular conductor and including compressible spring means for urging said second center conductor portion and thereby said crystal diode into electrical contact with said axially disposed resistor.

4. A crystal diode detector comprising: a tubular housing forming the outer conductor of a coaxial transmission structure; an axially disposed structure within said housing and forming the center conductor of the coaxial transmission structure, said axial disposed structure including in sequence an input pin member, a resistor conductively connected to said pin member, a crystal diode having its whisker portion enclosed in a non-metallic casing and resiliently urged against said resistor for electrical contact therewith, a plunger member conductively connected to and seating said crystal diode, a compressible spring member conductively coupled to said plunger for resiliently urging said crystal diode against said resistor and an output pin member conductively coupled to said spring member; and a further resistor radially disposed within the coaxial transmission structure and conductively connecting said input pin member and said tubular housing.

5. A crystal diode detector comprising: a tubular housing forming the outer conductor of a coaxial transmission structure, said tubular housing including a first portion, a second portion and a clamping member for axially connecting said first and said second portion; an axially disposed structure within said housing and forming the center conductor of the coaxial transmission structure, said axial disposed structure including, in the order stated, an input pin member having a closed axial bore of selected depth, a resistor partially inserted in said bore and conductively connected to the end of said bore, a crystal diode having a non-conductive envelope along a substantial portion of its length conductively coupled to said axial resistor, a plunger member dimensioned for sliding reception within said second portion conductively coupled to said crystal diode and having an anodized peripheral surface, said plunger member including means for axially seating said crystal diode, a compression spring member and an output pin member axially supported within said second portion, adjacent ends of said plunger member and said output pin member including means for engaging opposite ends of said spring member; a further resistor radially disposed with the coaxial transmission structure and conductively connecting said input pin member and the first portion of said housing; and a support member having at least a non-conductive body portion dimensioned for sliding reception by said first portion, said body portion firmly holding said input pin member, said axially disposed resistor and said radially disposed resistor.

6. A crystal diode detector comprising: a tubular housing forming the outer conductor of a coaxial transmission structure, said tubular housing including a first portion having a first inner diameter, a second portion having a second inner diameter substantially smaller than said first diameter and a clamping member for axially and demountably connecting said first and said second portion; an axially disposed structure within said housing and forming the center conductor of the coaxial transmission structure, said axial disposed structure including, in the order stated, an input pin member, a resistor, a crystal diode having its whisker portion enclosed in a non-conductive envelope, a plunger member, an extension spring member and an outer pin member; a non-conductive support cylinder; a conductive tubular member fitted about said support cylinder and having an outer surface dimensioned for sliding reception in said first portion, said support cylinder having axial bore with a reduced diameter section on one side thereof, one end of said input pin member being fitted into the portion of said axial bore and against the shoulder formed by said reduced diameter portion, said input pin member also having a closed bore in its fitted end of substantially the same diameter as said reduced diameter portion and of a selected depth, said resistor being fitted into said bore and reduced diameter portion and conductively connected to said input pin member, said plunger having a closed bore in its end to seat said crystal diode, the diameter of said plunger member being selected as small as feasible in view of the closed bore at its end and said second diameter being selected to slidingly receive said plunger member, the peripheral surface being anodized and having a reduced diameter portion of selected length and a selected axial position to provide a selected capacitive and inductive impedance, said output pin member being axially supported within said second portion and including spring means for urging said crystal diode through said plunger member into conductive contact with said resistor; and a further resistor radially disposed with said support cylinder and conductively connecting said input pin member and said tubular housing.

7. A crystal diode detector comprising: first and second outer conductors axially and demountably connected and forming the outer member of a coaxial transmission structure; a crystal diode axially disposed within said outer conductors, said crystal diode having a non-metallic envelope extending along a substantial portion of its length; a first center conductor portion axially mounted within said first outer conductor; a disposed axial resistor, having a selected resistive impedance, connecting said first center conductor portion and one end of said crystal diode, said first center conductor portion including a closed bore of selected depth for receiving one end portion of said axially disposed resistor and to thereby provide a selected amount of series capacitive impedance; a single radially disposed resistor of selected resistive impedance conductively coupling said first center conductor portion and said outer member; a second center conductor portion adjacent said crystal diode and including seating means for said crystal diode; and a third center conductor portion axially mounted with said second center conductor portion, said third center conductor portion including a conductive compressible spring means for urging said second center conductor portion and thereby said crystal diode against said axially disposed resistor to provide electrical contact therebetween.

8. A crystal diode detector in accordance with claim 7 in which a non-conductive support means of substantially cylindrical configuration is provided with an axial bore for holding said first center conductor portion and said axially disposed resistor, and with a radial bore for holding said radially disposed resistor, and a metallic sleeve around said support means which is slidably received by said first outer conductor.

9. A crystal diode comprising: first and second tubular members demountably and axially connected and forming the outer conductor of a coaxial transmission structure; a center conductor means for said coaxial transmission structure including, in sequence, an input pin member, a resistor of a selected impedance, a crystal diode sealed into a dielectric envelope, and a plunger member; at least one low-loss dielectric support means having a stepped axial bore and a radial bore communicating with the larger section of said stepped axial bore; a conductive sleeve member around said support means and having an opening in registry with said radial bore, said sleeve member being slidingly received by said first tubular member, one end portion of said input pin member being fitted into the larger section of said stepped axial bore and having a closed axial bore of a selected depth, the diameter of said closed axial bore being substantially the same as the smaller section of said stepped axial bore, said resistor being accommodated within said closed axial bore and the smaller section of said stepped axial bore and one terminal lead of said resistor being conductively coupled to the end of said bore; and a further resistor of a selected impedance fitted into said radial bore and having its terminal leads respectively connected to said input pin member and said sleeve member, said plunger member having an anodized peripheral surface of a diameter of substantially the same order of magnitude as the outer diameter of said crystal diode, said second tubular member being dimensioned for slidingly receiving said plunger, one end of said crystal diode being conductively seated in one end portion of said plunger and the other end of said crystal diode being urged against and into conductive contact with the other terminal lead of said resistor.

10. A crystal diode in accordance with claim 9 and including a spacer sleeve dimensioned for sliding reception within said first tubular member, said spacer sleeve being interposed between said conductive sleeve and adjacent end face of said second tubular member, the axial length of said spacer sleeve being selected so that said spacer sleeve is substantially coextensive with the whisker of said crystal diode and the inner diameter of said spacer sleeve being selected to be approximately equal to one-half of the shortest operating wavelength.

11. A crystal diode detector comprising: an input coaxial transmission structure; a crystal diode sealed into a non-conductive envelope which extends substantially along the axial length of said diode; and an output coaxial transmission structure having an inner conductor coupled to one terminal of said diode; means for conductively and demountably connecting the outer conductors of said input and output transmission structure, said input coaxial structure including a low-loss dielectric support means, a pin member having a closed bore of selected length supported by said support means, a resistor partially accommodated within said closed bore for providing a selected capacitive impedance between said pin member and said resistor, said resistor being conductively coupled between said pin member and the other terminal of said diode; and a further resistor radially supported by said support means and conductively coupling said pin member to the outer conductor of said input coaxial transmission structure.

12. A crystal diode detector comprising: a tubular member forming the outer conductor of a coaxial transmission structure and having separable first and a second portion of different internal diameters; a center conductor means for said coaxial transmission structure including, in sequence, an input pin member, a resistor of a selected impedance, a crystal diode sealed into a dielectric envelope, a plunger member, a compression spring member, an output pin member; at least one low-loss dielectric support means having a stepped axial bore and a radial bore; a conductive sleeve member encircling said support means and having an opening in registry with said radial bore, said sleeve member being slidingly received in said first portion of said tubular member, one end of said input pin member being fitted into one portion of said stepped axial opening and having a closed axial bore of a selected depth and of substantially the same diameter as the other portion of said stepped bore, said axial resistor being accommodated partially in said closed bore and partially in said stepped axial bore and one lead of said resistor being conductively coupled to the end of said closed axial bore, a further resistor of a selected impedance fitted into said radial bore and having its leads respectively connected to said input pin member and said sleeve member, said plunger member having a seating bore and an outer diameter which is of the same order of magnitude as the outer diameter of said crystals diode, the peripheral surface of said plunger member being anodized and dimensioned for sliding reception by said second portion of said tubular member, one terminal of said crystal diode being conductively seated in said seating bore, the other end of said plunger having means for receiving said spring member for urging said crystal diode firmly against the other lead of the axially disposed resistor, said output pin member being axially supported within said second portion of said tubular member and including means for receiving the other end of said spring means, said plunger being of a selected length and includes a reduced diameter section of selected length and selected axial position to provide a selected capacitive and inductive impedance.

References Cited by the Examiner

UNITED STATES PATENTS

| | | | |
|---|---|---|---|
| 2,427,087 | 9/47 | Carlson | 317—236 X |
| 2,557,122 | 6/51 | Leiphart | 329—162 |
| 2,813,972 | 11/57 | Anderson et al. | 329—162 X |
| 3,002,155 | 9/61 | Dees | 329—162 |
| 3,010,072 | 11/61 | De Broekert et al. | 329—162 |
| 3,049,682 | 8/62 | Waring | 333—70 |
| 3,069,636 | 12/62 | Hannon | 333—70 |
| 3,144,624 | 8/64 | Rypinski | 333—73 |

ROY LAKE, *Primary Examiner.*

ALFRED L. BRODY, *Examiner.*